United States Patent [19]
Ogawa et al.

[11] Patent Number: 6,109,860
[45] Date of Patent: Aug. 29, 2000

[54] TWO-ARMED TRANSFER ROBOT

[75] Inventors: Hironori Ogawa, Osaka; Ryusuke Tsubota, Sakai, both of Japan

[73] Assignee: Daihen Corporation, Osaka, Japan

[21] Appl. No.: 09/211,591

[22] Filed: Dec. 14, 1998

[30] Foreign Application Priority Data

Dec. 26, 1997 [JP] Japan ................................. 9-368398

[51] Int. Cl.$^7$ ................................................ B25J 18/04
[52] U.S. Cl. ...................... 414/744.5; 901/15; 414/917; 74/479.01
[58] Field of Search ........................ 414/744.5, 744.6, 414/744.1; 901/15, 8; 74/479.01

[56] References Cited

U.S. PATENT DOCUMENTS

| | | |
|---|---|---|
| 5,083,869 | 1/1992 | Nakata et al. . |
| 5,151,008 | 9/1992 | Ishida et al. . |
| 5,333,986 | 8/1994 | Mizukami et al. . |
| 5,421,695 | 6/1995 | Kimura . |
| 5,439,547 | 8/1995 | Kumagai . |
| 5,584,647 | 12/1996 | Uehara et al. . |
| 5,636,963 | 6/1997 | Haraguchi et al. . |
| 5,647,724 | 7/1997 | Davis, Jr. et al. . |
| 5,667,354 | 9/1997 | Nakazawa . |
| 5,713,717 | 2/1998 | Cho . |
| 5,725,352 | 3/1998 | Tanaka . |
| 5,765,444 | 6/1998 | Bacchi et al. . |
| 5,813,823 | 9/1998 | Hofmeister . |

FOREIGN PATENT DOCUMENTS

| | | |
|---|---|---|
| 7-142552 | 6/1995 | Japan . |
| 8-71965 | 3/1996 | Japan . |

*Primary Examiner*—Donald W. Underwood
*Attorney, Agent, or Firm*—Merchant & Gould P.C.

[57] ABSTRACT

A two-armed transfer robot is provided which includes an upper arm mechanism and a lower arm mechanism which is substantially identical to the upper arm mechanism. Each arm mechanism is provided with a handling member for carrying a workpiece to be processed. Each arm mechanism is also provided with a pantograph assembly consisting of a base arm, an outer link, a pair of intermediate links and an inner link. The handling member of each arm mechanism is arranged to be spaced from a central driving shaft when the handling member is retreated closer to the shaft. The base arm of the pantograph assembly is inclined away from the handling member when the handling member is retreated closer to the shaft. At the same time, the intermediate links are also inclined away from the handling member.

3 Claims, 16 Drawing Sheets

TWO-ARMED TRANSFER ROBOT

BACKGROUND OF THE INVENTION

1. Field of the Invention

The present invention relates to a two-armed transfer robot useful for semiconductor manufacturing equipment, liquid crystal display processing equipment and the like. More particularly, the present invention relates to a two-armed transfer robot for transferring workpieces between processing chambers under a vacuum.

2. Description of the Related Art

In general, transfer robots are used for semiconductor manufacturing equipment, liquid crystal display processing equipment and the like. The robot has at least one arm mechanism provided with a handling member. An object to be processed or workpiece such as a silicon wafer is placed on the handling member. The arm mechanism is capable of moving horizontally in a straight line as well as rotating in a horizontal plane. A plurality of processing chambers for performing various kinds of processing are arranged around a rotation axis of the robot. With the use of the transfer robot, the workpiece is suitably brought to and taken away from a selected one of the processing chambers.

For improving efficiency in the transferring operation, use has been made of the so-called two-armed transfer robot having two arm mechanisms. Each arm mechanism has a free end at which a handling member is mounted.

Conventionally, various kinds of two-armed transfer robots have been proposed. One example of such transfer robots is disclosed in JP-A-No. 7(1995)-142552 for example.

The conventional robot disclosed in the above document is shown in FIGS. 14–17 of the accompanying drawings.

Specifically, the illustrated conventional robot includes a stationary base frame 80, an inner frame 81 and a first arm 82. The inner frame is rotatable about a vertical axis O1 relative to the base frame 80, while the first arm is rotatable about a first axis P1 extending in parallel to the axis O1. The inner frame 81 is caused to rotate by a driving device fixed to the base frame 80, while the first arm 82 is caused to rotate by another driving device fixed to the inner frame 81.

Reference numeral 83 indicates a second arm which is rotatable relative to the first arm 82 about a second axis Q1 (see FIG. 15) extending in parallel to the first axis P1, while reference numeral 84A indicates a handling member which is rotatable relative to the arm 83 about a third axis R1 extending in parallel to the second axis Q1. Reference numeral 85 indicates a first rotation-transmitting member which is fixed to the inner frame 81 coaxially with the first axis P1, while reference numeral 86 indicates a second rotation-transmitting member which is fixed to the second arm 83 coaxially with the second axis Q1. Reference numeral 87 indicates a third rotation-transmitting member fixed to the first arm 82 coaxially with the second axis Q1, while reference numeral 88 indicates a fourth rotation-transmitting member fixed to the handling member 84 coaxially with the third axis R1.

A first connecting member 89 is provided between the first rotation-transmitting member 85 and the second rotation-transmitting member 86, while a second connecting member 90 is provided between the third rotation-transmitting member 87 and the fourth rotation-transmitting member 88. The distance S between the first and second axes is equal to the distance between the third and fourth axes. The radius ratio of the first rotation-transmitting member 85 to the second rotation-transmitting member 86 is 2 to 1. The radius ratio of the fourth rotation-transmitting member 88 to the third rotation-transmitting member 87 is also 2 to 1.

Chain sprockets or pulleys may be used for the first to fourth rotation-transmitting members 85–88. Correspondingly, the first and second connecting members 89, 90 may be chains or timing belts.

A first arm mechanism 91 is made up of the above-mentioned elements 82–90. A second arm mechanism 92, which is symmetrical to the first arm mechanism with respect to the X—X line, is supported for rotation about the second axis P2 extending in parallel to the axis O1.

Thus, the distance between the axis O1 and the first axis P1 is equal to that between the axis O1 and the second axis P2. The two-armed transfer robot is made up of the above elements 80–92.

The operations of the first and the second arm mechanisms 91, 92 are symmetrical with respect to the X—X line and substantially the same. Therefore, description will only be made to the operation of the first arm mechanism 91.

First, it is assumed that the inner frame 81 is kept stationary relative to the base frame 80, and that the first, second and third axes P1, Q1, R1 are initially located on a common straight line, as shown in FIG. 16. Starting from this state, the first arm 82 is rotated counterclockwise through an angle θ about the first axis P1.

During the above operation, the first rotation-transmitting member 85 is held stationary, while the second axis Q1 is moved counterclockwise around the first axis P1 through the angle θ. (Thus, the second axis Q1 is shifted from the initial position to a position Q11.) As a result, a Y1-side portion of the first connecting member 89 is wound around the first rotation-transmitting member 85, whereas a Y2-side portion of the same member is unwound from the first rotation-transmitting member 85.

Thus, as shown in FIG. 16, the first connecting member 89 is moved in a direction indicated by arrows a1 and a2. As a result, the second rotation-transmitting member 86 is rotated clockwise about the second axis Q1.

As previously mentioned, the radius ratio of the first rotation-transmitting member 85 to the second rotation-transmitting member 86 is 2 to 1. Thus, when the first arm 82 is rotated counterclockwise about the first axis P1 through the angle θ, the second rotation-transmitting member 86 is rotated clockwise about the second axis Q11 through an angle 2θ.

At that time, since the second rotation-transmitting member 86 is fixed to the second arm 83, the second rotation-transmitting member 86 and the second arm 83 are rotated clockwise about the second axis Q1 through an angle 2θ.

If the second arm 83 did not change its orientation relative to the first arm 82, the third axis would be brought to an R11 position shown by broken lines. In an actual operation, however, the second rotation-transmitting member 86 is rotated clockwise about the second axis Q11 through an angle 2θ. Therefore, the third axis R11 is moved clockwise about the second axis Q11 through the same angle 2θ, to be brought to the R12 position.

This means that, even after the first arm 82 is rotated counterclockwise about the first axis P1 through an angle θ, the third axis R12 is still on the straight line extending through the first and the third axis P1 and R1.

When the second arm 83 is rotated clockwise about the second axis Q11 through an angle 2θ, bringing the third axis R11 to the R12 position, a Y2-side portion of the second connecting member 90 is wound around the third rotation-transmitting member 87, whereas a Y1-side portion of the same member is unwound from the third rotation-transmitting member 87.

As a result, the second connecting member 90 will be shifted in a direction b1–b2 shown in FIG. 16. Thus, the fourth rotation-transmitting member 88 is rotated counterclockwise about the third axis R12.

When the second arm 83 is rotated clockwise about the second axis Q11 through an angle 2θ as described above, the fourth rotation-transmitting member 88 is rotated counterclockwise about the third axis R12 through an angle θ (the radius ratio of the fourth rotation-transmitting member 88 to the third rotation-transmitting member 87 is 2 to 1). As a result, a point C0 of the fourth rotation-transmitting member 88 is brought to a position C1 on the straight line passing through the first and the third axes P1, R12.

Upon rotation of the first arm 82 about the first axis P1 in the counterclockwise direction as described above, the first arm mechanism 91 is actuated in the X-direction. Accordingly, the handling member 84A is moved along the line passing through the first and the third axes P1, R1. During this operation, however, the handling member 84A does not change its attitude or orientation since it is fixed to the fourth rotation-transmitting member 88. (As stated above, the fourth rotation-transmitting member 88 maintains its initial orientation during the above operation.)

Likewise, the second arm mechanism 92 is actuated in the X-direction, with the second handling member 84B keeping its initial attitude along the line passing through the first and the third axes P2, R2.

The first and the second handling members 84A, 84B are arranged between the axes P1, P2 as viewed in the Y1–Y2 direction (FIG. 16). Further, the extremities of the handling members 84A, 84B are vertically spaced from each other. Thus, upon actuation of the arm mechanisms 91, 92, the handling members 84A, 84B can move along the X—X line passing through the axis O1 without interfering with each other.

When the inner frame 81 is rotated about the axis O1, the first and the second arm mechanisms 91, 92 are simultaneously rotated about the axis O1.

As shown in FIG. 17, a suitable number of processing chambers (six chambers, in the figure) are arranged around the axis O1 of the two-armed transfer robot. Workpieces are transferred by the robot to these chambers 71–76.

The conventional transfer robot has been found disadvantageous in the following respects.

First, as shown in FIGS. 14–16, the axis P1 of the first arm mechanism 91 and the axis P2 of the second arm mechanism 92 are spaced from each other, with the axis O1 of the inner frame 81 located therebetween. This arrangement renders the rotation radius of the inner frame 81 unfavorably large.

Accordingly, the bearings 93 provided around the inner frame 81 need to have an unfavorable large diameter. The magnetic fluid seal 94 for hermetic sealing suffers the same problem. With the use of such bearings and magnetic fluid seal, the overall size of the robot will be unfavorably large, so that the robot will become unduly expensive.

Another problem is that the driving devices for moving the handling members 84A, 84B are mounted on the inner frame 81. With such an arrangement, in operation, the driving devices are rotated together with the inner frame 81. However, in the conventional transfer robot, use is made of a cable extending from the base frame 80 for supplying the driving devices with electricity. Thus, in order to prevent breakage of the cable, it is necessary to stop the rotation of the inner frame 81 before it has been rotated too many times in the same direction (more than 540° for example).

For controlling the rotation of the inner frame 81, the user of the conventional robot may rely on an additional monitor and controlling unit for example. However, such devices make the transfer robot additionally expensive. More importantly, the additional devices merely serve to restrict the operational freedom of the transfer robot but cannot allow the user to operate the transfer robot freely.

Further, in the conventional robot, the first arm mechanism 91 and the second arm mechanism 92 are arranged to move together (simultaneously) around the first axis O1 upon rotation of the inner frame 81. Such an operation gives rise to the following inconvenience.

Referring to FIG. 17, it is assumed that a plurality of silicon wafers to be processed are initially stored in the chamber 72. For subjecting the silicon wafers to a predetermined processing, each of the stored silicon wafers needs to be transferred from the storing chamber 72 to one of the chambers 71 and 73–76. For that purpose, first, the first and second arm mechanisms 91, 92 are actuated, so that workpieces will be shifted onto the handling members 84A and 84B from the storing chamber 72. The silicon wafer placed on the handling member 84A (called "first wafer" hereinafter) may be carried into the chamber 73 (a target chamber), while the silicon wafer placed on the other handling member 84B (called "second wafer" hereinafter) may be carried into the chamber 71 (another target chamber).

For transferring the first wafer to the chamber 73, the inner frame 81 is caused to pivot clockwise (as seen in FIG. 17) through a certain angle (say, 45 degrees), so that the handling member 84A is brought into facing relation to the chamber 73. (The time needed for the inner frame 81 to perform the above pivoting movement will be called "time T1" hereinafter.) Then, the first arm mechanism 91 is actuated to shift the first wafer into the chamber 73. (The time needed for the first arm mechanism 91 to perform the shifting operation will be called "time T2.")

After the first wafer has been properly placed in the chamber 73, the inner frame 81 is caused to pivot counterclockwise through a certain angle (say, 90 degrees) to bring the handling member 84B into facing relation to the chamber 71. Then, the second arm mechanism 92 is actuated to shift the second wafer into the chamber 71. (The time needed for the inner frame 81 to rotate through a certain angle for moving the arm mechanisms from the chamber 73 to the storing chamber 72 will be called "time T3.")

In the conventional transfer robot, during the above operation, the second wafer is simply placed on the handling member 84B (i.e., without being subjected to any processing procedure) for the above-defined times T1, T2 and T3. This means that a certain length of idle time (the sum of the times T1, T2 and T3) has to unfavorably lapse before the processing for the second wafer can be started.

As can be seen, the above idle time will increase with the distance between the target chambers. In addition, the transferring operation may need to be performed many times a day (with respect to all of the target chambers 71 and 73–76). In that case, even if the idle time for each transfer operation is short, the total of the idle times may be unfavorably large.

In view of the problems described above, two-armed transfer robots capable of performing effective operations with less idle time have been conventionally sought for.

SUMMARY OF THE INVENTION

It is, therefore, an object of the present invention to provide a compact, inexpensive two-armed transfer robot which is easy to operate and capable of providing good productivity.

According to the present invention, there is provided a two-armed transfer robot comprising:

a first arm mechanism and a second arm mechanism, each arm mechanism being provided at an extremity thereof with a handling member for carrying a workpiece to be processed, the handling member arranged not only to linearly move in a horizontal plane but to rotate in the horizontal plane;

a stationary base member;

first to fourth shafts rotatable about a first axis extending vertically, each shaft being coaxially supported by the base member; and first to fourth driving devices associated with the first to the fourth shafts, respectively, each driving device being attached to the base member;

wherein the first arm mechanism has a pantograph assembly including a first arm, an outer link, a pair of intermediate links and an inner link, the first arm being connected to the first shaft, the outer link being supported with respect to the first arm for pivotal movement about a second axis extending in parallel to the first axis, each intermediate link being supported with respect to the outer link for pivotal movement about a pair of third axes, the third axes being spaced outward from the second axis, the second axis being located between the third axes as viewed circumferentially about the first axis, the inner link being supported with respect to each intermediate link for pivotal movement about a fourth axis located at a free end of said each intermediate link, the inner link being spaced from the first to fourth shafts, a distance between the third axis and the fourth axis being equal to a distance between the first axis and the second axis;

the first arm mechanism further having a first rotation-transmitting member fixed to the second shaft, a second rotation-transmitting member fixed to the outer link in a coaxial manner with the second axis, a third rotation-transmitting member fixed to the first arm in a coaxial manner with the second axis, a pair of fourth rotation-transmitting members each fixed to one of the intermediate links in a coaxial manner with the third axis, a first connecting member extending between the first and the second rotation-transmitting members, and a second connecting member extending between the third and the fourth rotation-transmitting members;

the handling member being spaced from the first to fourth shafts when the handling member is retreated closer to the shafts;

the first arm being inclined about the first axis in a direction opposite to the handling member when the handling member is retreated closer to the shafts, while the intermediate link being inclined about the third axis in a direction opposite to the handling member when the handling member is retreated closer to the shafts;

the second arm mechanism being connected to the third and fourth shafts, the second arm mechanism being substantially identical to the first arm mechanism, the handling member of the first arm mechanism being spaced vertically from the handling member of the second mechanism;

the handling members of the first and second arm mechanisms being arranged not only to linearly move in horizontal straight lines passing through the first axis but to rotate independently of each other around the first axis.

With such an arrangement, it is possible to cause the handling member of each arm mechanism to move an advantageously long distance from an inwardly retreated position to a fully extended position. Specifically, in the above transfer robot, the first arm is caused to incline about the first axis in a direction opposite to the handling member, when the handling member is retreated closer to the shafts. Likewise, the intermediate link is also inclined about the third axis in the opposite direction. Thus, the rotational angle of the first arm for moving the handling member can be made greater than is conventionally possible. Accordingly, the handling member can be moved through a long distance.

Further, with the above arrangement, the first to fourth shafts are coaxially supported. Thus, the bearings supporting those shafts are reduced in diameter. This is advantageous since the transfer robot as a whole can be made smaller.

According to a preferred embodiment of the present invention, the transfer robot further comprises a cover member arranged between the handling member of the first arm mechanism and the handling member of the second arm mechanism. The cover member is formed with an opening for allowing passage of the shafts.

With such an arrangement, unfavorable small particles (such as dust) are reliably prevented from falling onto the lower arm mechanism from above.

According to a preferred embodiment, each of the first to the fourth shafts is rotatably supported via a magnetic fluid seal for hermetic sealing.

Other objects, features and advantages of the present invention will become clearer from the following detailed description given with reference to the accompanying drawings.

DETAILED DESCRIPTION OF THE PREFERRED EMBODIMENTS

Figure 1A:
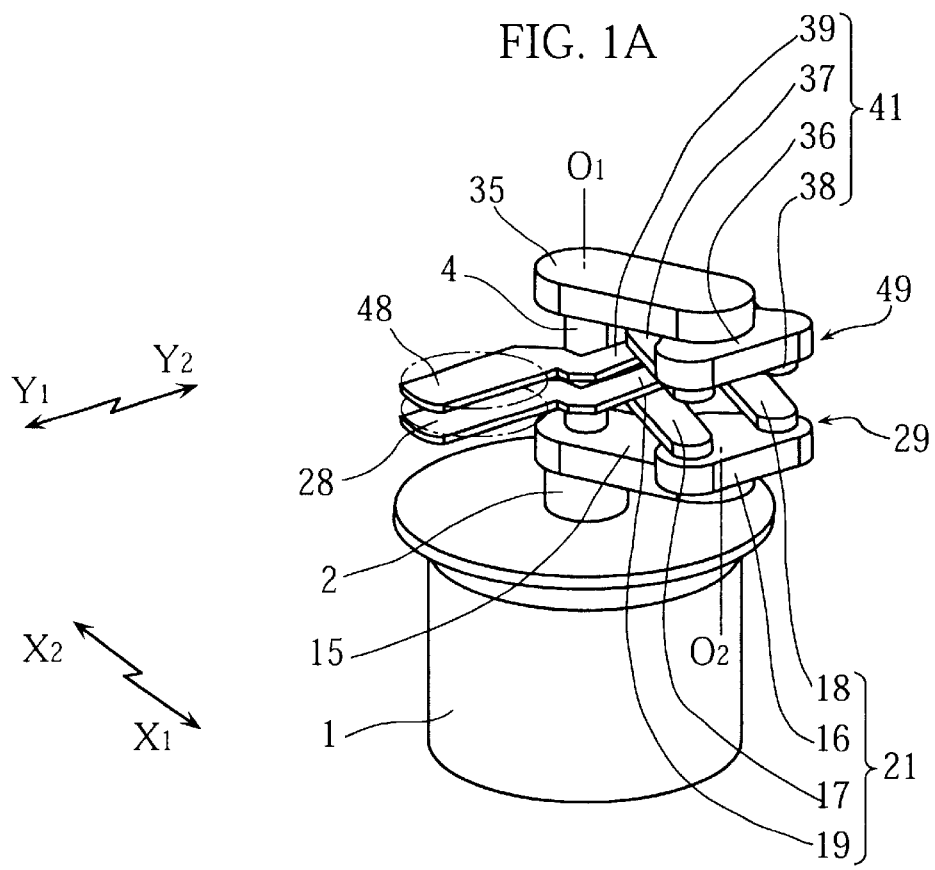
FIG. 1A is a perspective view showing a two-armed transfer robot according to a first embodiment of the present invention, wherein a first and a second arm mechanisms are folded in preparation for rotational movement.
Figure 1B:
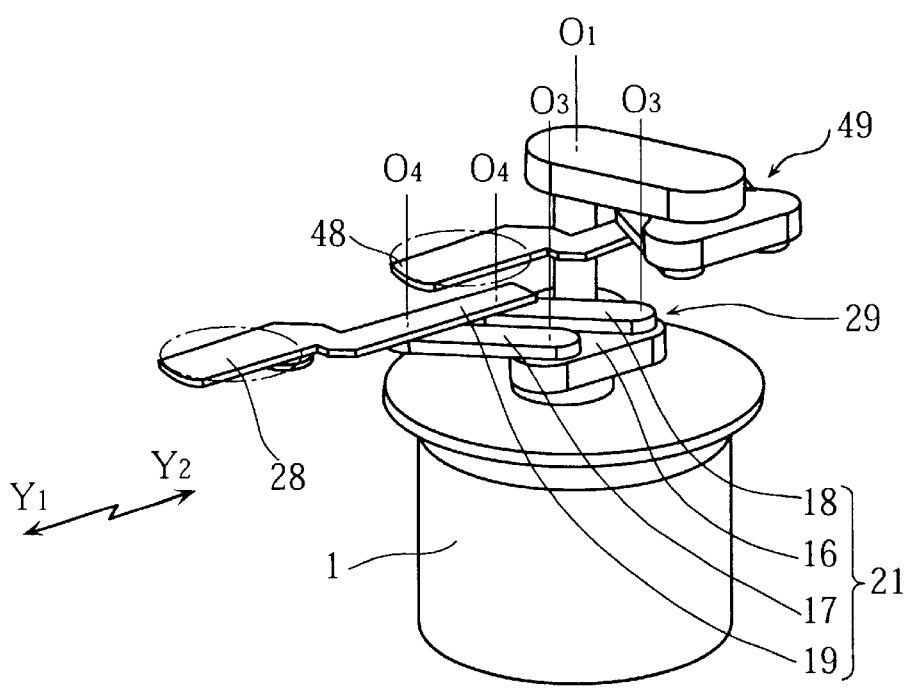
FIG. 1B illustrates the same transfer robot as shown in FIG. 1A, wherein a first handling member is being extended by the first arm mechanism.

The preferred embodiments of the present invention will be described below with reference to the accompanying drawings.

Reference is first made to FIGS. 1A–11B which show a two-armed transfer robot according to a first embodiment of the present invention. The illustrated transfer robot includes a stationary base member 1 and first to fourth shafts 2–5. The shafts 2–5 are supported by the base member 1 via suitable bearings and caused to coaxially rotate about a first axis O1 which extends vertically. The base member 1 may be installed in a vacuum chamber V.C. For maintaining the vacuum condition in the vacuum chamber, magnetic fluid seals 6–9 are provided around the respective shafts 2–5.

The illustrated robot also includes first to fourth driving device 11–14 for actuation of the respective shafts 2–5. Each driving device is associated with a corresponding shaft via a suitable speed reducer, a rotation-transmitting member such as a sprocket or a pulley for example, and a connecting member such as a chain or a timing belt.

The robot further includes a first arm 15, an outer link 16, a pair of intermediate links 17, 18 and an inner link 19. The first arm 15 is connected to the first shaft 2. The outer link 16 is pivotable with respect to the first arm 15 about a second axis O2 extending in parallel to the first axis O1. The intermediate links 17, 18 are pivotable with respect to the outer link 16 about a pair of third axes O3. As viewed from above, the third axes O3 are outwardly offset from the second axis O2, and spaced from each other. Thus, as viewed circumferentially about the first axis O1, the second axis O2 is located between the pair of third axes O3. Each intermediate link has a free end through which a fourth axis O4 extends vertically. The inner link 19 is pivotable about a pair of fourth axes O4 of the respective intermediate links. A pantograph assembly 21 is made up of the inner link 19, the pair of intermediate links 17, 18, and the outer link 16. The distance between the third and the fourth axes O3, O4 is equal to that between the first and the second axes O1, O2.

A first rotation-transmitting member 27 is attached to the second shaft 3, while a second rotation-transmitting member 23 is attached to the outer link 16. The second rotation-transmitting member 23 has a central axis coinciding with the second axis O2. Further, a third rotation-transmitting member 28 is attached to the first arm 15, while fourth rotation-transmitting members 25 are attached to the respective intermediate links 17, 18. The third rotation-transmitting member 28 has a central axis coinciding with the second axis O2, while each of the fourth rotation-transmitting members 25 has a central axis coinciding with one of the third axes O3. A first connecting member 26 is provided between the first and the second rotation-transmitting members 22, 23, while a second connecting member 27 is provided between the third and the fourth rotation-transmitting members 28, 25. The first rotation-transmitting member 22 is equal in diameter to the second rotation-transmitting member 23, while the third rotation-transmitting member 28 is equal in diameter to the fourth rotation-transmitting member 25.

A first arm mechanism 29 is made up of the above-mentioned elements 15–28.

The illustrated robot also has a second arm mechanism 49 connected to the third shaft 4 and fourth shaft 5. The second arm mechanism 49, which is made up of elements 35–48, has an arrangement substantially identical to that of the first arm mechanism 29.

Figure 2:
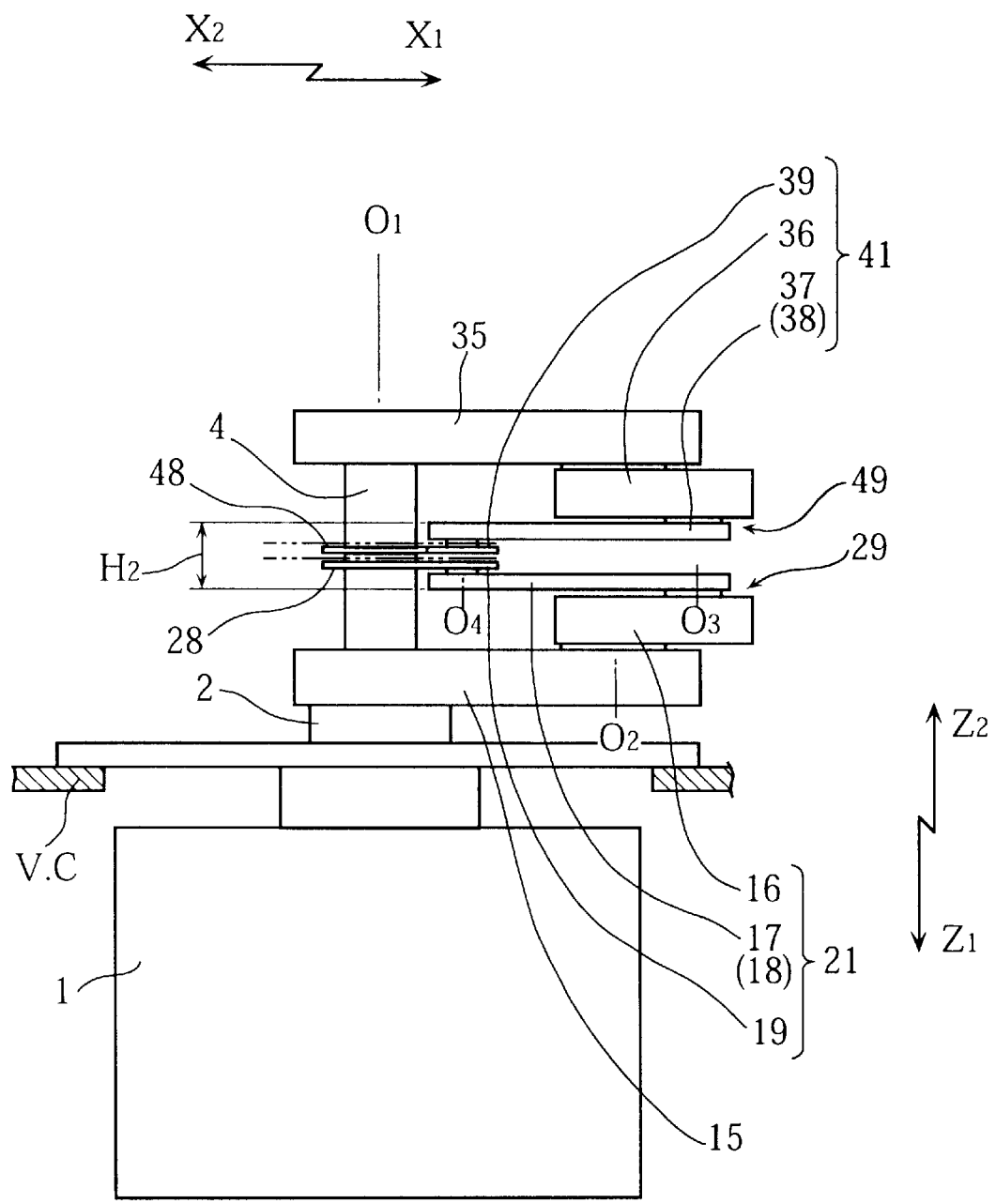
FIG. 2 is a front view showing the transfer robot of FIG. 1.

As best shown in FIG. 2, the first and the second arm mechanisms 29, 49 are spaced from each other in a vertical direction (Z-direction).

The inner link 19 of the pantograph assembly 21 carries a first handling member 28, while the inner link 39 of the pantograph assembly 41 carries a second handling member 48. The first and the second handling members 28, 48 are vertically spaced from each other.

As will be described later, the first and the second handling members 28, 48 are arranged not only to move horizontally in straight lines passing through the first axis O1 but to rotate or revolve around the first axis O1.

The illustrated transfer robot is made up of the elements 1–49 described above. A suitable number of processing chambers (not shown) are arranged around the first axis O1 in a conventional manner.

Figure 3:
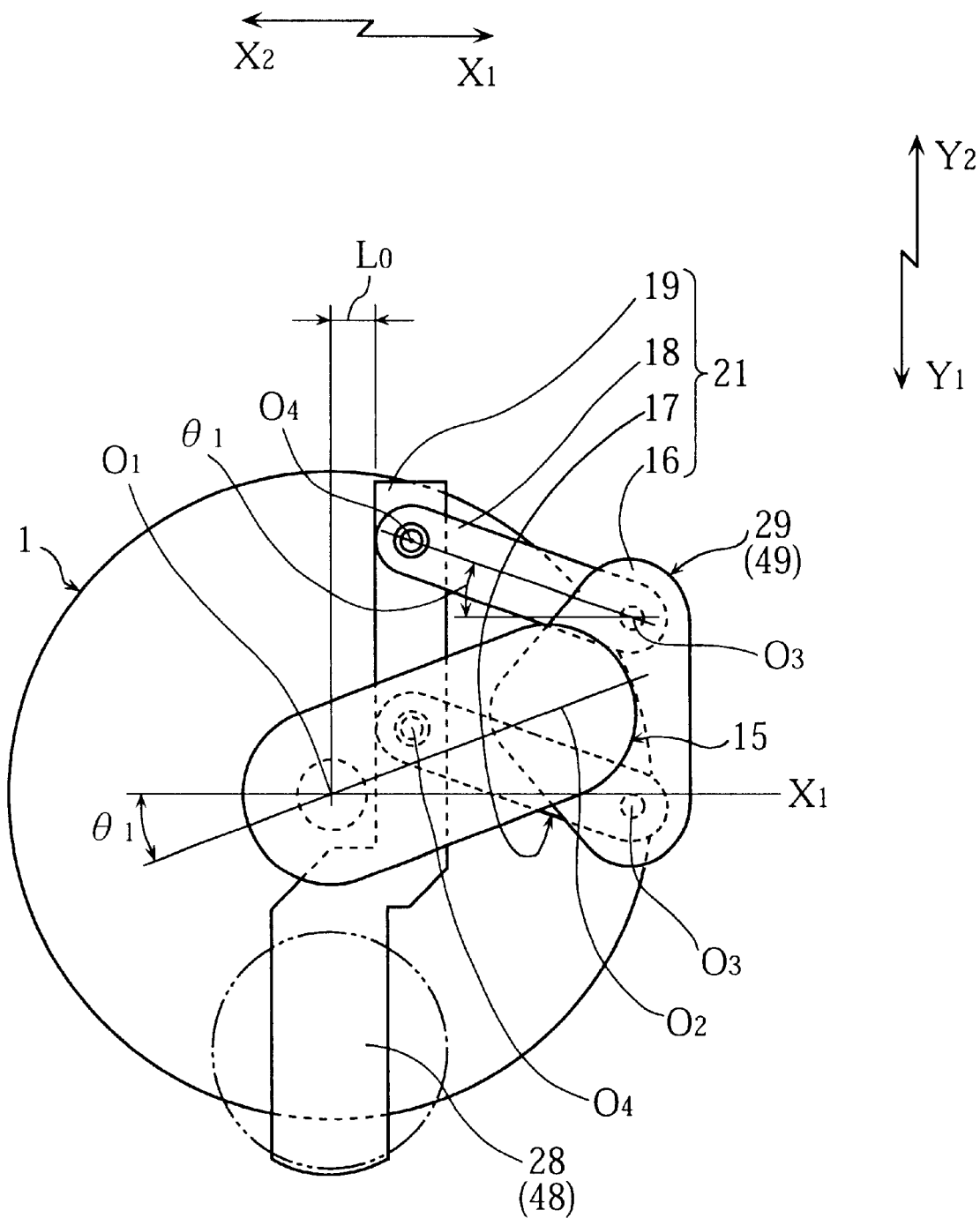
FIG. 3 is a plan view showing the transfer robot of FIG. 1.
Figure 4:
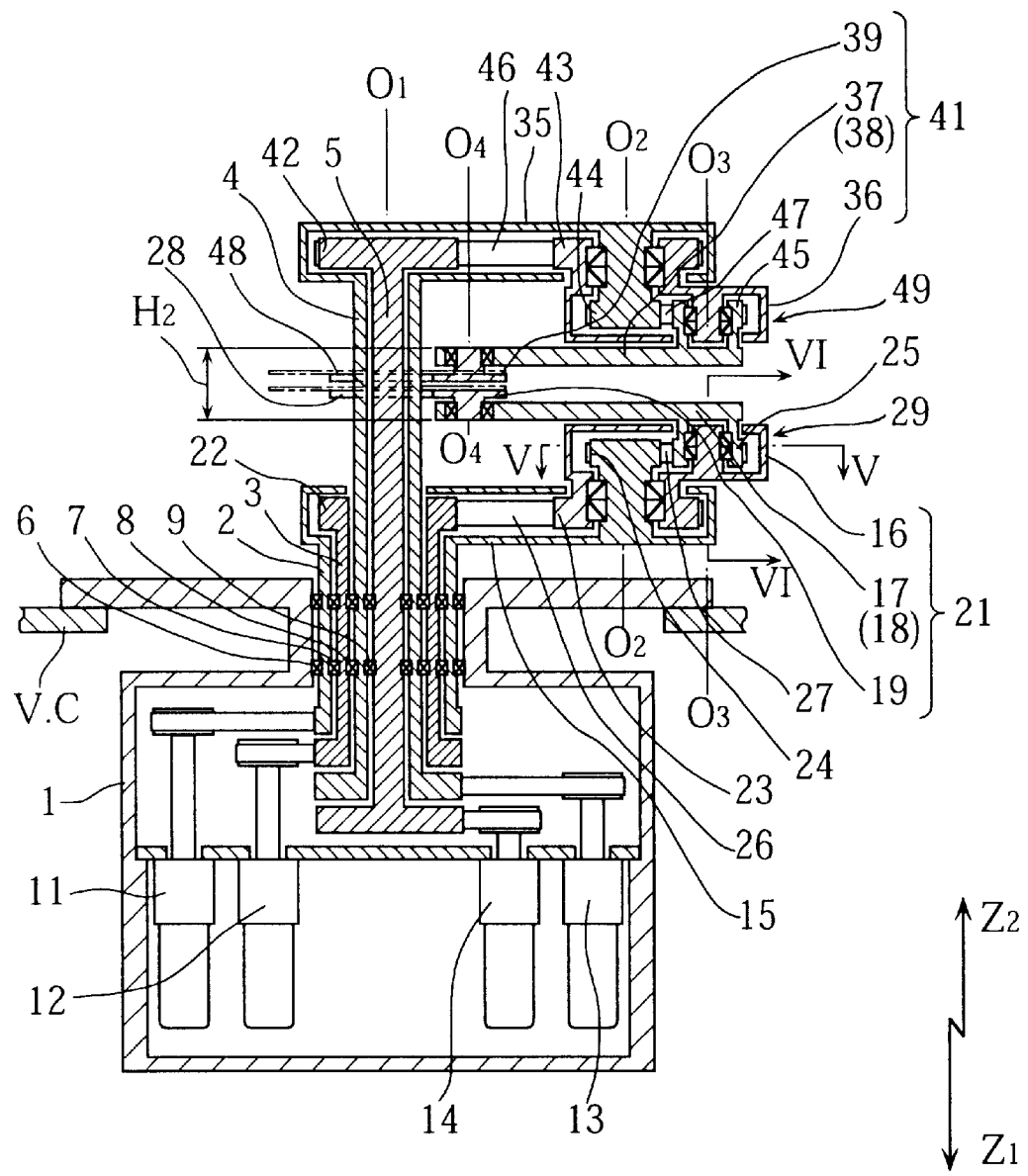
FIG. 4 is a sectional view showing the transfer robot of FIG. 1.
Figure 5:
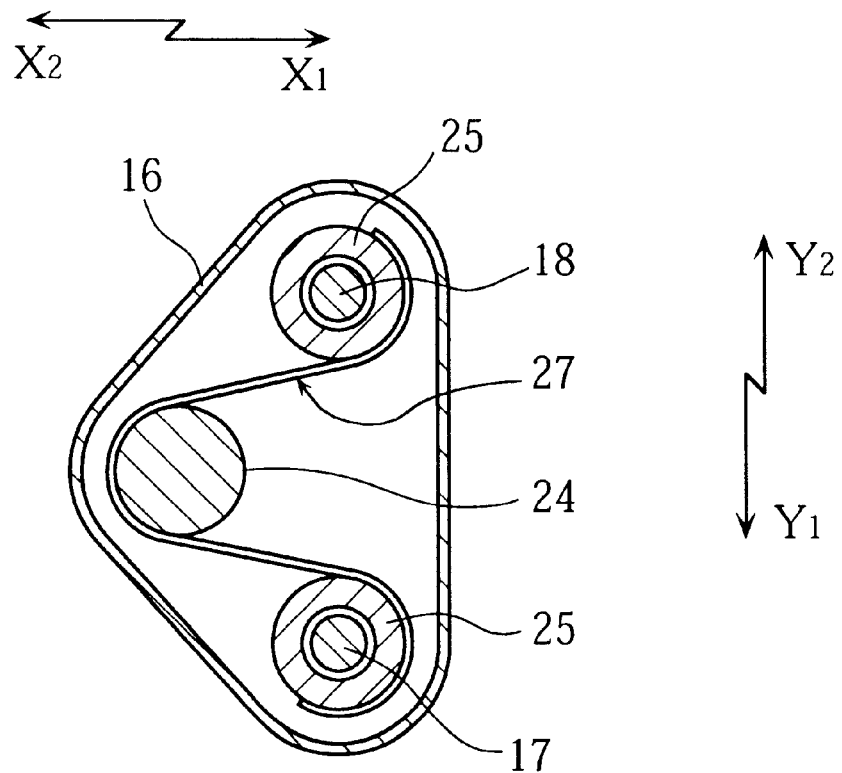
FIG. 5 is a sectional view taken along lines V—V in FIG. 4.
Figure 6:
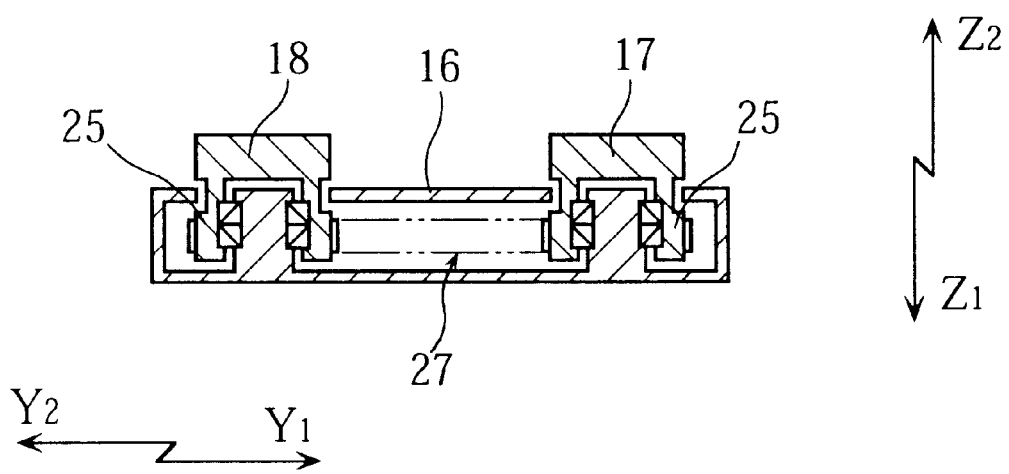
FIG. 6 is a sectional view taken along lines VI—VI in FIG. 4.

Description will now be made to the operation of the first arm mechanism 29. It is assumed that, as shown in FIG. 3, the straight line passing through the first and the second axes O1, O2 initially intersects the straight line O1–X1 at an angle θ1. Starting from that initial position, the first arm 15 will be rotated clockwise about the first axis O1 through a certain angle θ.

Figure 7A:
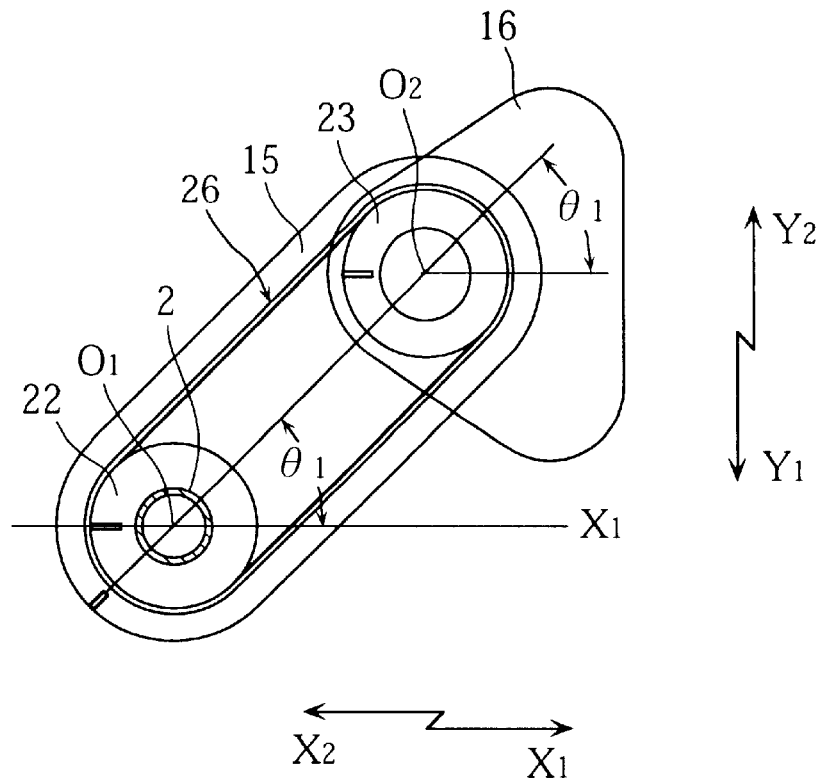
FIGS. 7A and 7B are plan views illustrating the movement of principal parts shown in FIG. 4.
Figure 7B:
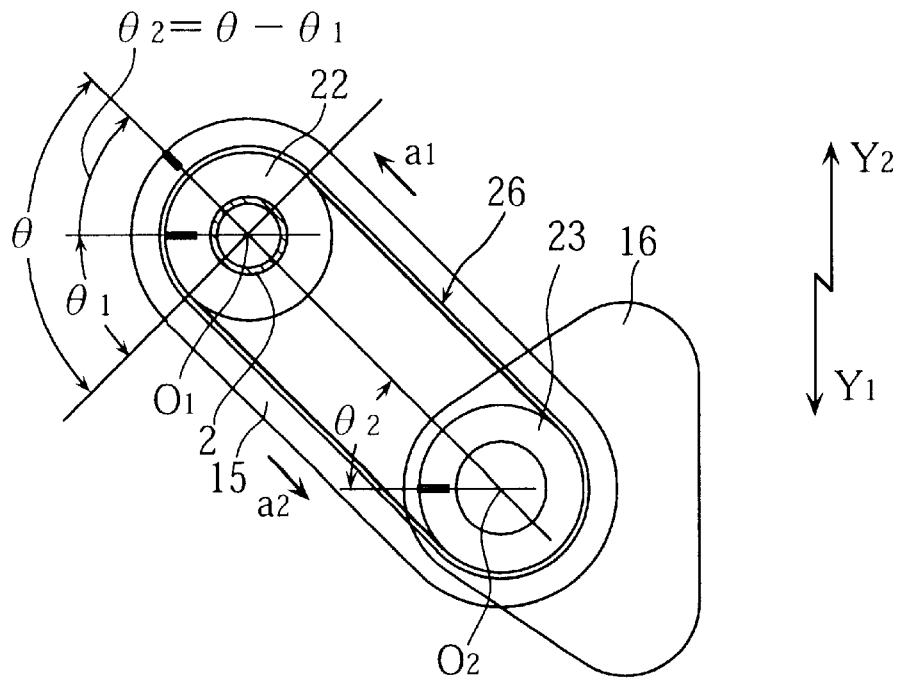

Upon actuation of the first driving device 11, the first shaft 2 is rotated, clockwise for example, about the first axis O1 through the angle θ (see FIG. 7B). At this time, the first arm 15 is rotated clockwise about the first axis O1 through the same angle θ. During that operation, however, the second driving device 12 associated with the second shaft 3 will not be actuated. Thus, the first rotation-transmitting member 22, which is attached to the second shaft 3, remains stationary.

Thus, when the first arm 15 is rotated through the angle θ from the position shown in FIG. 7A to the position shown in FIG. 7B, a Y1-side portion of the first connecting member 26 is unwound from the first rotation-transmitting member 22, whereas a Y2-side portion of the first connecting member 26 is wound around the first rotation-transmitting member 22. As a result, the first connecting member 26 is moved in a direction shown by arrows a1 and a2 (FIG. 7B). Accordingly, the second rotation-transmitting member 23 is rotated counterclockwise about the second axis O2 through the angle θ.

The second rotation-transmitting member 23 is fixed to the outer link 16. Thus, when the first arm 15 is rotated through the angle θ (=θ1+θ2), from the position of FIG. 7A to the position of FIG. 7B, the outer link 16 is caused to shift in position but to maintain its initial orientation.

Figure 8A:
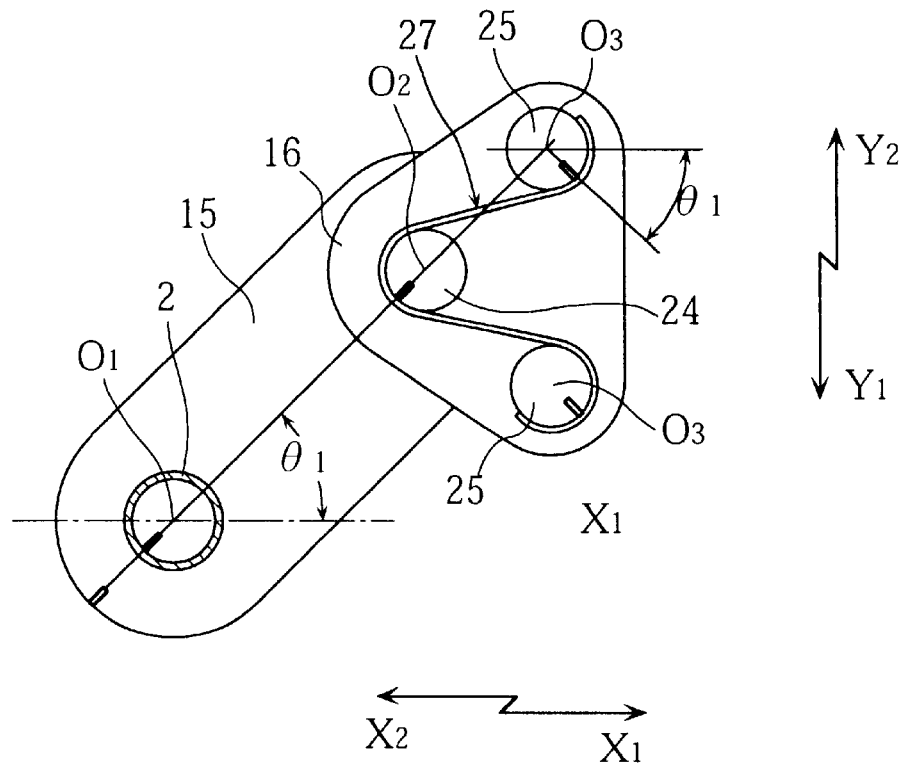
FIGS. 8A and 8B are plan views illustrating the movement of principal parts shown in FIG. 4.
Figure 8B:
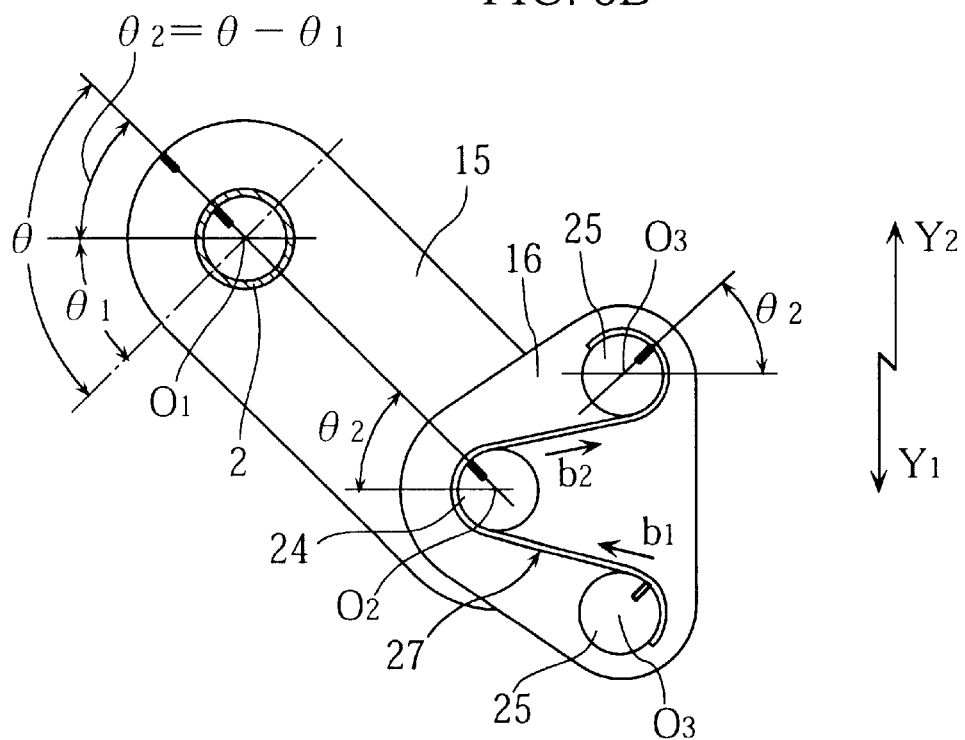

Referring to FIGS. 8A and 8B, description will now be made to the operation of the second connecting member 27 associated with the third and fourth rotation-transmitting members 24, 25.

Specifically, when the first arm 15 is rotated through the angle θ (=θ1+θ2), from the position shown in FIG. 8A to the position shown in FIG. 8B, the third rotation-transmitting member 24 (which is fixed to the first arm 15) is rotated clockwise about the second axis O2 through the angle θ. Thus, the second connecting member 27 is moved in a direction shown by arrows b1 and b2. As a result, the fourth rotation-transmitting member 25 is rotated counterclockwise about the third axis O3 through the angle θ.

The fourth rotation-transmitting members 25 are fixed to the respective intermediate links 17, 18. Thus, upon rotation of the first arm 15 in the above-described manner, the pantograph assembly 21 (consisting of the outer link 16, the intermediate links 17, 18 and the inner link 19) is displaced from the position shown in FIG. 9 to the position shown in FIG. 10.

As previously described, the distance between the third and the fourth axes O3, O4 is equal to that between the first and the second axes O1, O2. Further, the first and the second rotation-transmitting members 22, 23 are equal in diameter, and the third and the fourth rotation-transmitting members 24, 25 are equal in diameter. Thus, upon clockwise rotation of the first arm 15 about the first axis O1 through the angle θ from the position shown in FIG. 9 to the position shown in FIG. 10, the intermediate links 17, 18 of the pantograph assembly 21 are caused to pivot counterclockwise about the third axes O3 through the angle θ with respect to the initial position.

Figure 9:
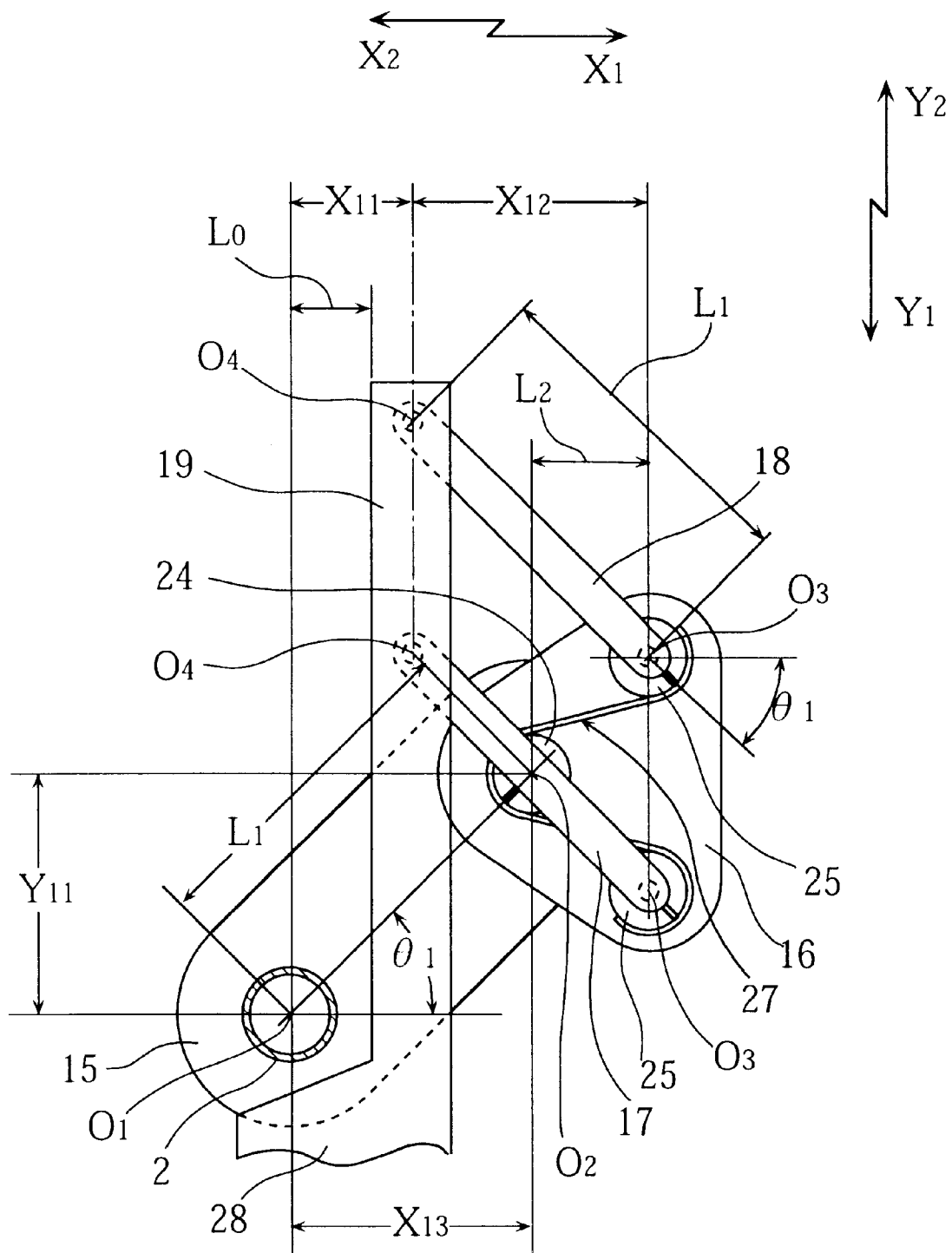
FIG. 9 is a plan view illustrating the movement of principal parts shown in FIG. 4.
Figure 10:
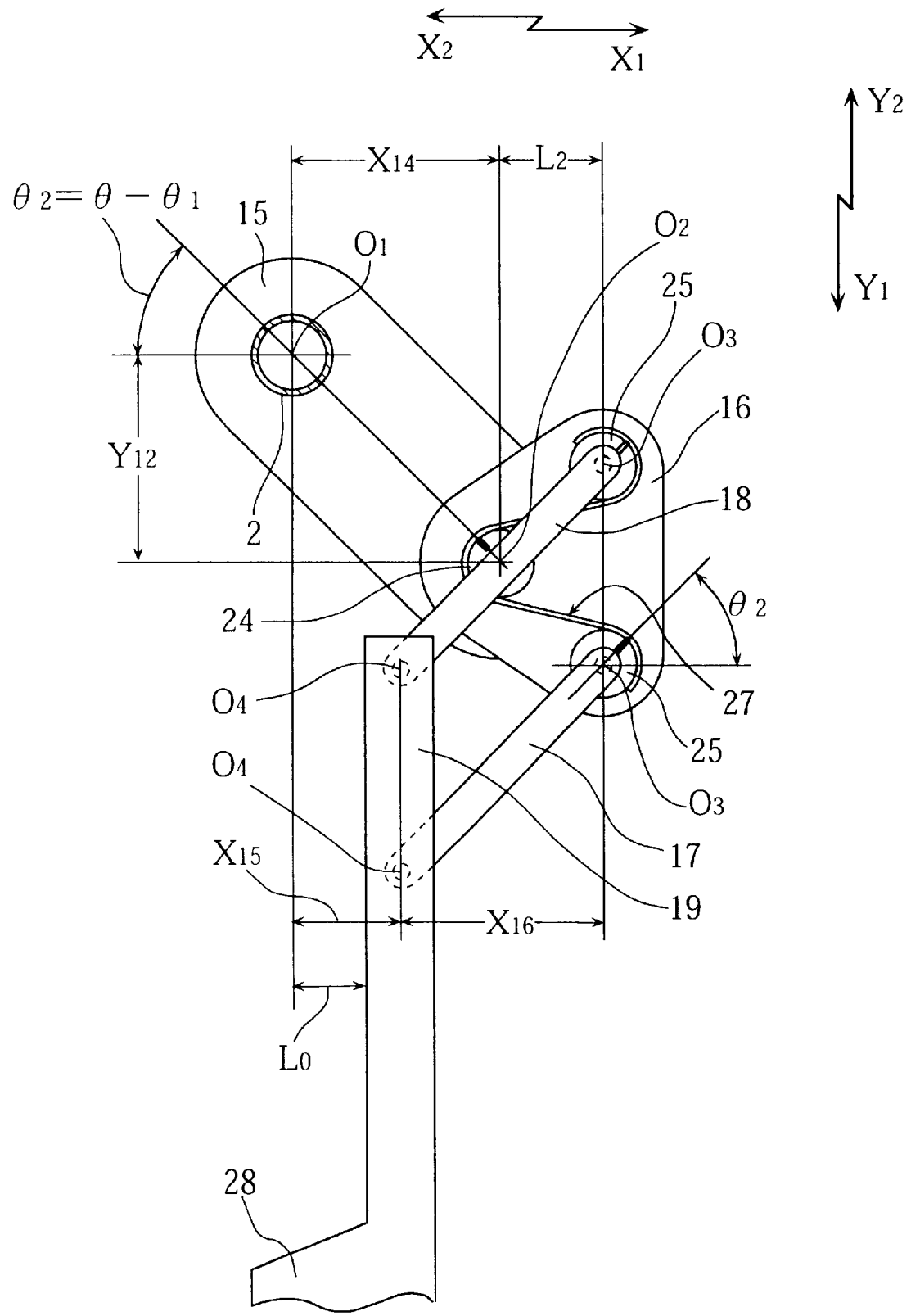
FIG. 10 is a plan view illustrating the movement of principal parts shown in FIG. 4.

Referring to FIGS. 9 and 10, it is assumed that the distance between the first and second axes O1, O2 and the distance between the third and fourth axes O3, O4 are L1, while the distance between the second and third axes O2, O3 is L2. Further, it is assumed that, as viewed in the X-direction, the distances defined among the first to fourth axes O1–O4 are X11–X16, as illustrated. Then, the following equations hold:

$$X12 = X13 = L1\cos\theta1;$$

$$X14 = X16 = L1\cos\theta2 = L1\cos(\theta - \theta1);$$

$$X13 + L2 = X12 + X11; \text{ and}$$

$$X14 + L2 = X16 + X15.$$

From those relations, it can be known that X11=L2 and X15=L2, i.e., X11=X15=L2. Thus, when the first arm 15 is rotated clockwise or counterclockwise about the first axis O1, the pantograph 21 is displaced in a manner such that the straight line O4—O4 will not change its orientation nor position. Thus, the inner link 19 of the pantograph assembly 21 is moved in parallel to the fixed, horizontal line passing through the first axis O1, so that the distance L0 to the first axis O1 is constant.

Further, it is assumed that the distance between the first axis O1 and the second axis O2 (before the rotation of the first arm 15; FIG. 9) is Y11 as viewed in the Y-direction, while the distance between the same elements (after the rotation of the first arm 15; FIG. 10) is Y12. Then, the following equations hold:

$$Y11 = L1\sin\theta1; \text{ and}$$

$$Y12 = L1\sin\theta2 = L1\sin(\theta - \theta1).$$

As can be seen from FIGS. 9 and 10, as a result of the rotation of the first arm 15, the second axis O2 is displaced by (Y11+Y12) in the Y1-direction.

When the first arm 15 is thus rotated, each of the intermediate links 17, 18 is rotated in an equal amount about the third axes O3. Therefore, when the first arm 15 is rotated clockwise about the first axis O1 by the angle θ (=θ1+θ2), the first handling member 28 is displaced by a distance of 2×(Y11+Y12) in the Y1-direction.

The first and the second handling members 28, 48 are attached to the respective arm mechanisms 29, 49 in a manner that they are vertically spaced from each other and project from the inner links 19, 39, respectively. In operation, each of the handling members 28, 48 will be moved so that their longitudinal center lines are displaced along a horizontal line extending through the first axis O1 (see FIGS. 3 and 13).

Referring back to FIG. 1B, in operation, the first arm mechanism 29 will be horizontally extended in a radial direction upon actuation of the first driving device 11. As a result, the first handling member 28 is linearly moved in the Y1-direction to be brought to a predetermined outer position. At that position, a workpiece will be shifted onto or away from the first handling member 28.

After the shifting of the workpiece is completed, the first arm mechanism will be folded or retreated to the original position, bringing the first handling member 28 closer to the first axis O1 (FIG. 1A). With the first handling member 28 held in the state shown in FIG. 1A, the first handling member 28 will be moved or revolved around the first axis O1.

When the first handling member 28 is held in the retreated position shown in FIG. 1A, the first and second driving devices 11, 12 will be operated synchronously so that the first and second shafts 2, 3 are caused to rotate at the same rate in the same direction. Then, every component of the first arm mechanism 29 will be moved about the first axis O1 in the same direction. Thus, while maintaining the state shown in FIG. 4, the first arm mechanism 29 will be rotated clockwise or counterclockwise about the first axis O1 (see also FIG. 3) through a desired angle.

After the first handling member 28 has been rotated through the desired angle, the first driving device 11 will be actuated. As a result, the first handling member 28 is caused to move outwardly along a horizontal line passing through the first axis O1, and is eventually brought to a predetermined point at which a workpiece will be shifted onto or away from the first handling member 28.

After the shifting of the workpiece has been completed, the first handling member 28 is caused to retreat inwardly toward the first axis O1 to prepare for a next rotational movement about the first axis O1.

The second arm mechanism 49, which is spaced vertically from the first arm mechanism 29, is operated in the same manner as the first arm mechanism 29.

Specifically, when the third driving device 13 is actuated while the fourth driving device 14 is held at rest, the second handling member 48 is caused to move outwardly to a predetermined point for shifting a workpiece onto or away from the second handling member 48.

Thereafter, the second handling member 48 is retreated back to the original position to prepare for a rotational movement. In this state, the third and fourth driving devices 13, 14 are synchronously actuated to rotate at the same rate in the same direction. As a result, the second arm mechanism as a whole is moved about the first axis O1. Here, it should be appreciated that, since the second arm mechanism 49 and the first arm mechanism 29 are spaced vertically from each other, the second arm mechanism 49 will not interfere with the first arm mechanism 29 even when they are actuated independently.

Figure 11A:
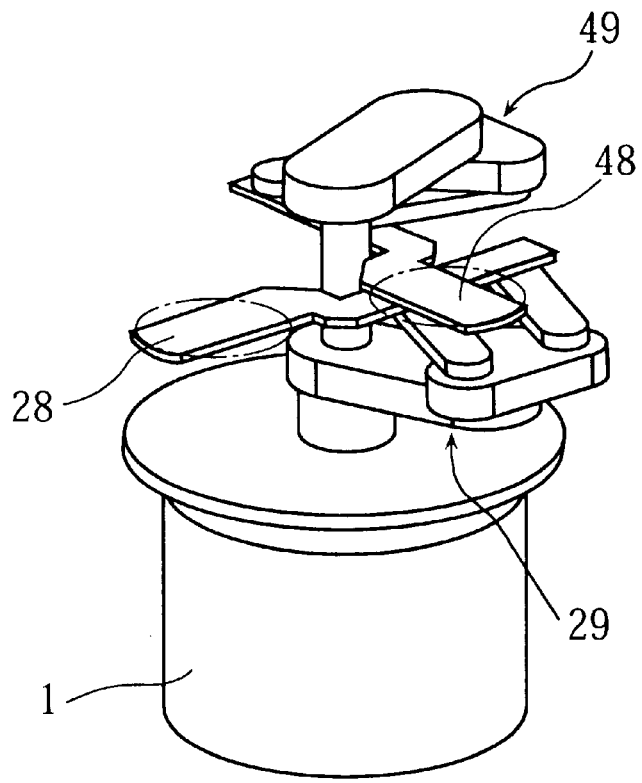
FIG. 11A is a perspective view illustrating the movement of the transfer robot of FIG. 1, wherein a second handling member is caused to pivot by the second arm mechanism.
Figure 11B:
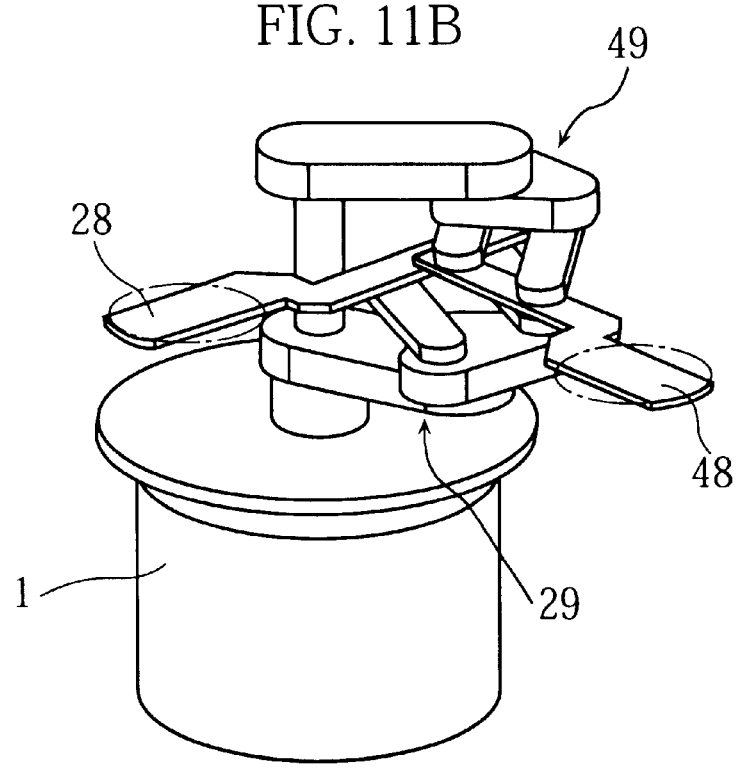
FIG. 11B is a perspective view illustrating the movement of the transfer robot of FIG. 1, wherein the second handling member is caused to linearly move by the second arm mechanism.

At a certain moment of an actual operation, the first and second arm mechanisms 29, 49 may be retreated closer to the first axis O1, as shown in FIG. 1A. Starting from that initial position, the second arm mechanism 49, for instance, will be rotated counterclockwise about the first axis O1 through 90 degrees, as shown in FIG. 11A.

Thereafter, when the second arm mechanism 49 is actuated, the second handling member 48 will be moved horizontally away from the first axis O1. Then, when the second handling member 48 reaches a predetermined position, a workpiece will be shifted onto or away from the second handling member 48.

According to the first embodiment, when the first handling member 28 is in the retreated position shown in FIG. 3, the inner end of the handling member 28 is suitably spaced from the rotation shaft (the shaft is depicted in broken line). Further, the outer end of the first arm 15 is held at a position spaced away from the line O1–X1 in the Y2 direction. In other words, as viewed from the position of the first axis O1, the first arm 15 is inclined in the Y2-direction. Similarly, the intermediate links 17, 18 are also inclined in the Y2-direction, as viewed from the positions of the third axes O3.

With such an arrangement, it is possible to obtain an advantageously long-stroke movement for the first handling member 28 by rotating the first arm 15 about the first axis O1 through a large angle. Thus, according to the first embodiment, the first handling member 28 can be moved through a long distance. In addition, when the handling member is retreated to the inner position, the components of the first arm mechanism and the handling member can be compactly collected around the first axis O1.

It should be noted that the above advantages hold for the second arm mechanism 49 and the second handling member 48.

In order to move the first handling member 28 along a horizontal straight line by rotating the first arm 15, it is necessary to render the distance between the first and second axes O1, O2 to be equal to the distance between the third and fourth axes O3, O4. (In the illustrated embodiment, those distances are L1.) According to the first embodiment, as shown in FIG. 9, the third axes O3 are offset outwardly from the second axis O2 by a distance L2. Thus, as viewed in the X-direction, the distance between the fourth axes O4 (which extend through the inner link 19) and the first axis O1 is kept to be L2 even when the first arm 15 is rotated about the first axis O1. Therefore, it is possible to move the first handling member 28 (fixed to the inner link 19) along a straight line without being interfered with by the rotation shaft.

Further, according to the first embodiment, as previously described, the first to the fourth shafts are coaxially supported for rotational movement about a vertical axis. Thus, the bearings supporting the first to the fourth shafts 2–5 and the magnetic fluid seals 6–9 can be made small in diameter. This means that the transfer robot of the present invention can be compact and inexpensive.

Further, each inner link is supported by a link mechanism which can be made small in thickness. Thus, the total height H2 (see FIG. 2 for example) of the base portions of each handling member is made advantageously small. Thus, each processing chamber can be provided with a small window for insertion of the handling members.

Further, it is possible to actuate the first handling member 28 and the second handling member 48 independently of each other without being interfered with. Thus, even when the first handling member 28 is being operated in relation to one of the processing chambers, it is possible to simultaneously operate the second handling member 48 in relation to another processing chamber. In this manner, substantially no idle time will be produced.

Still further, according to the first embodiment, the first to fourth driving devices are fixed to the stationary base member 1. Thus, the power cable for supplying the driving devices with electricity does not break due to the rotation of the arm mechanisms. Such an arrangement makes it possible for the first and the second handling members 28, 48 to rotate around the first axis O1 through any desired angle. Thus, the robot of the first embodiment is more conveniently used than the conventional transfer robot, with improved productivity. In addition, the transfer robot of the first embodiment is made inexpensive since there is no need to use additional devices for monitoring the rotation angle of the handling members.

Figure 12:
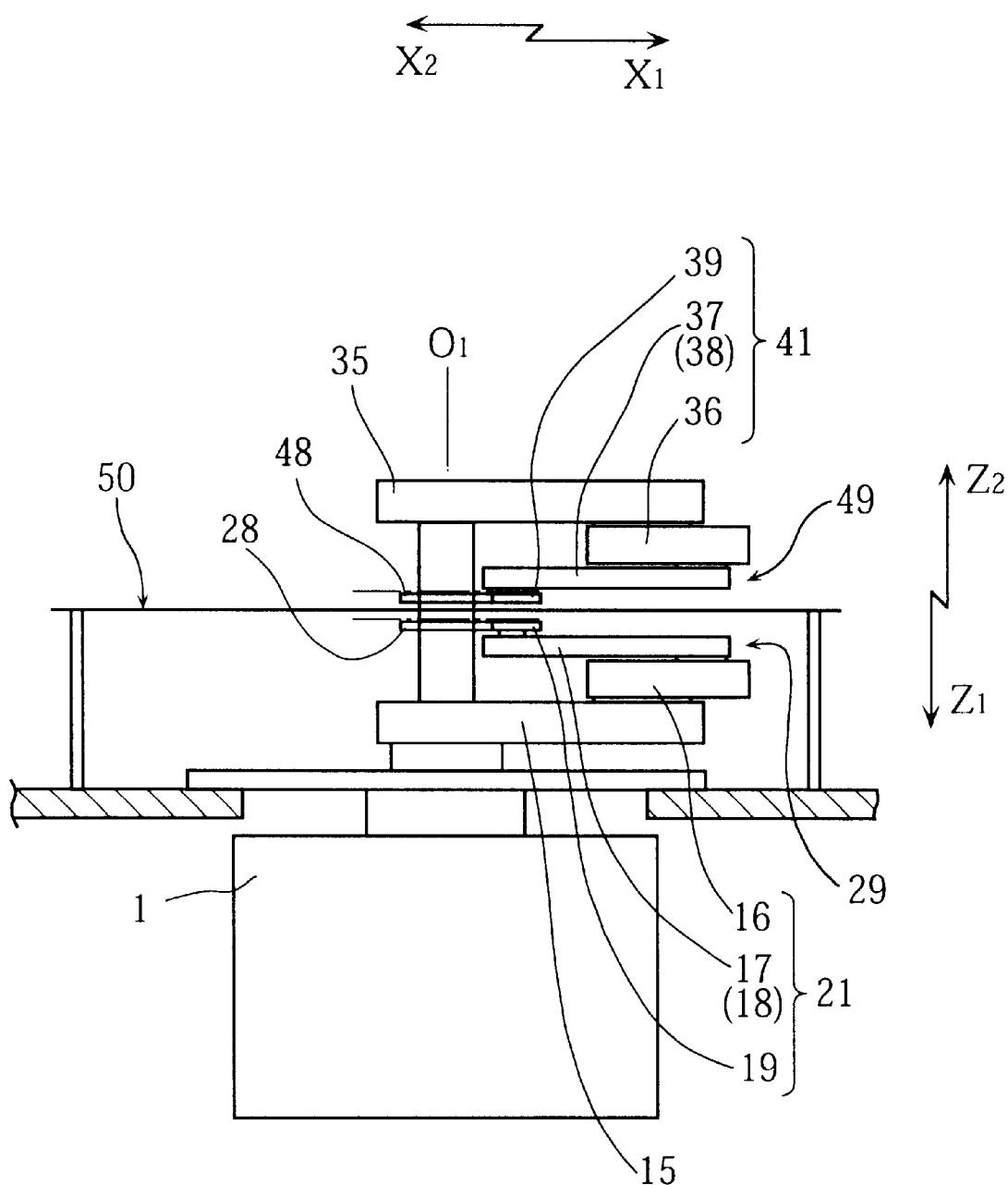
FIG. 12 is a front view showing a two-armed transfer robot according to a second embodiment of the present invention.
Figure 13:
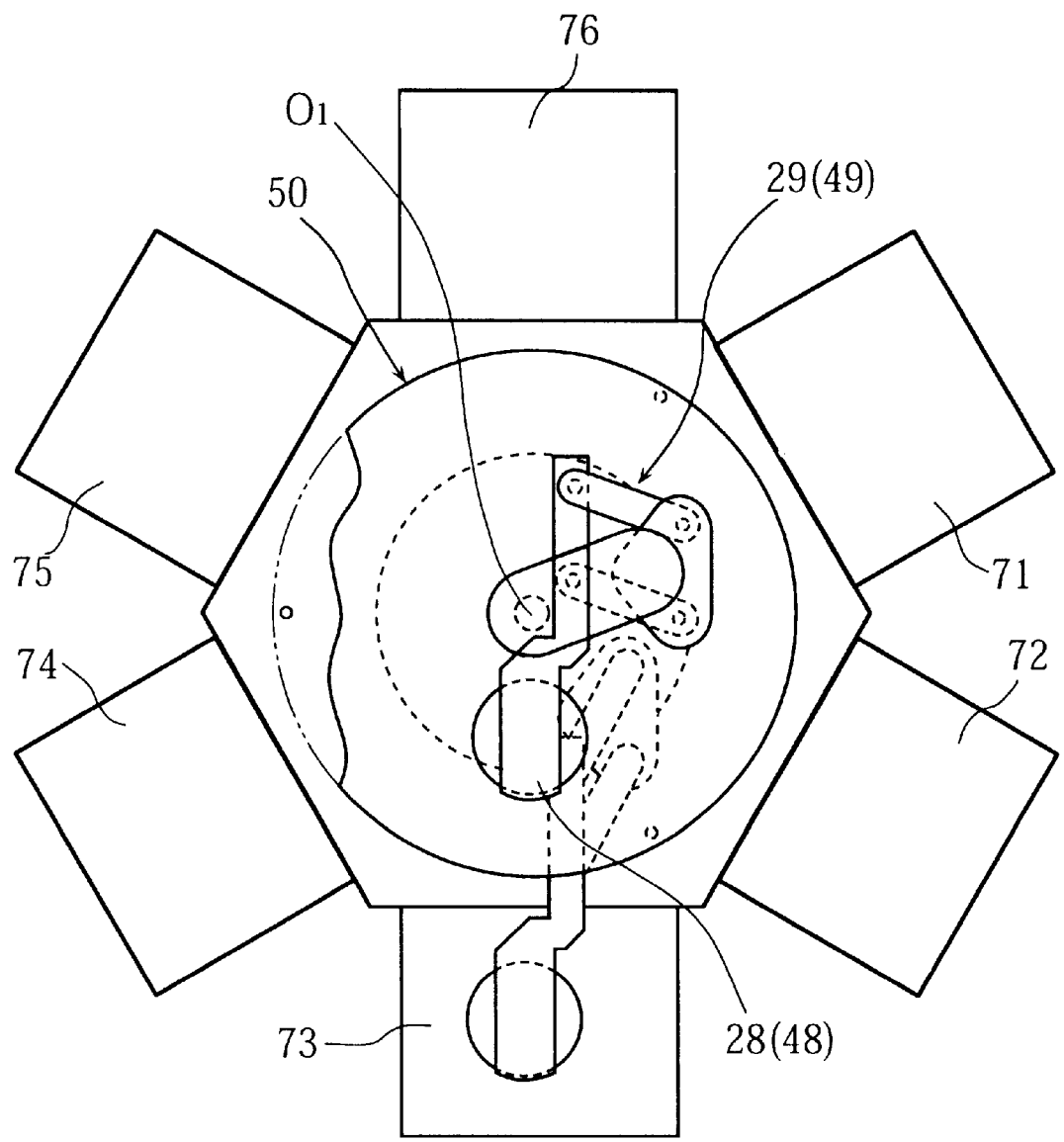
FIG. 13 is a plan view showing the transfer robot of FIG. 12.
Figure 14:
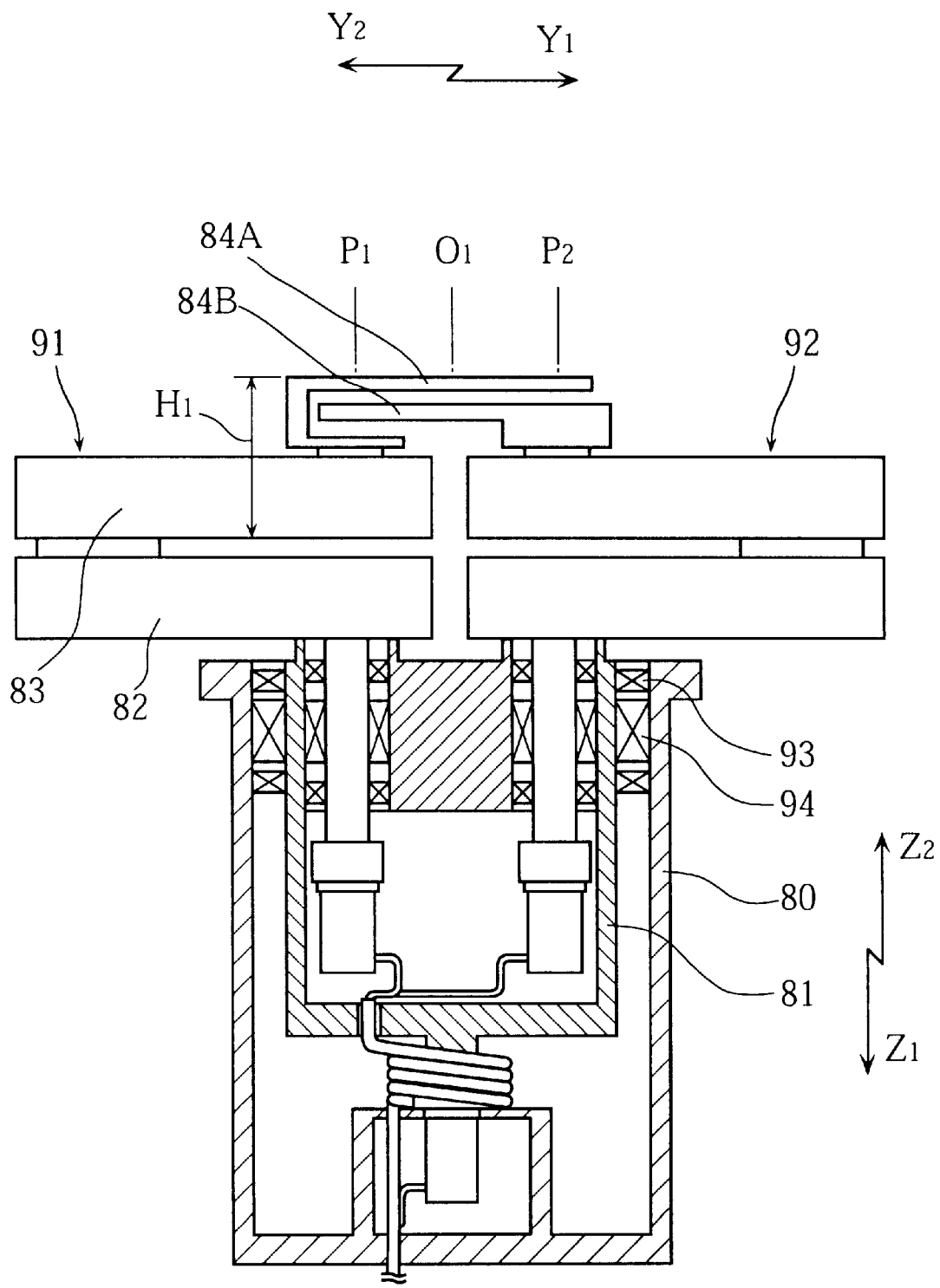
FIG. 14 is a sectional front view showing a conventional two-armed transfer robot.
Figure 15:
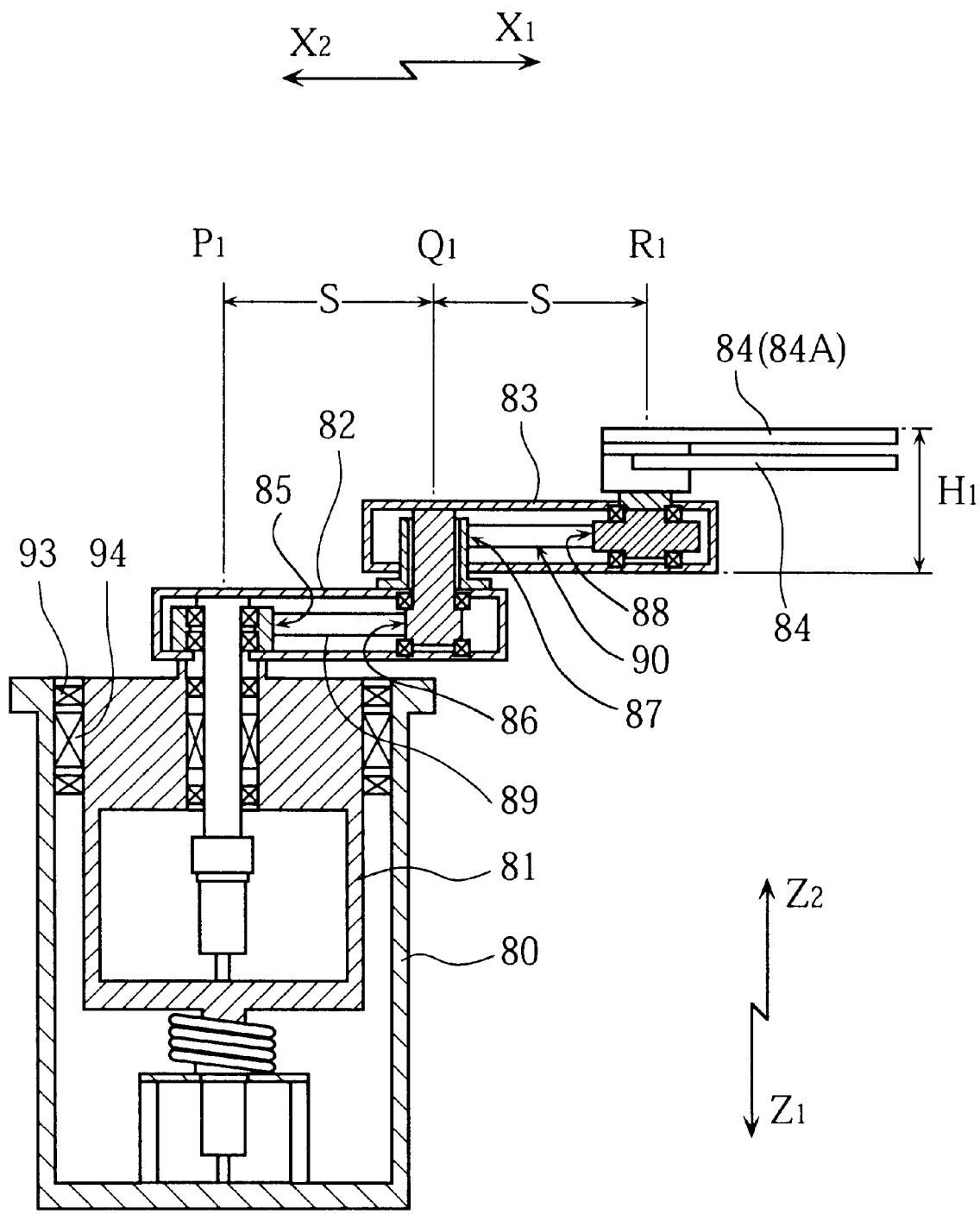
FIG. 15 is a sectional side view showing the transfer robot of FIG. 14.
Figure 16:
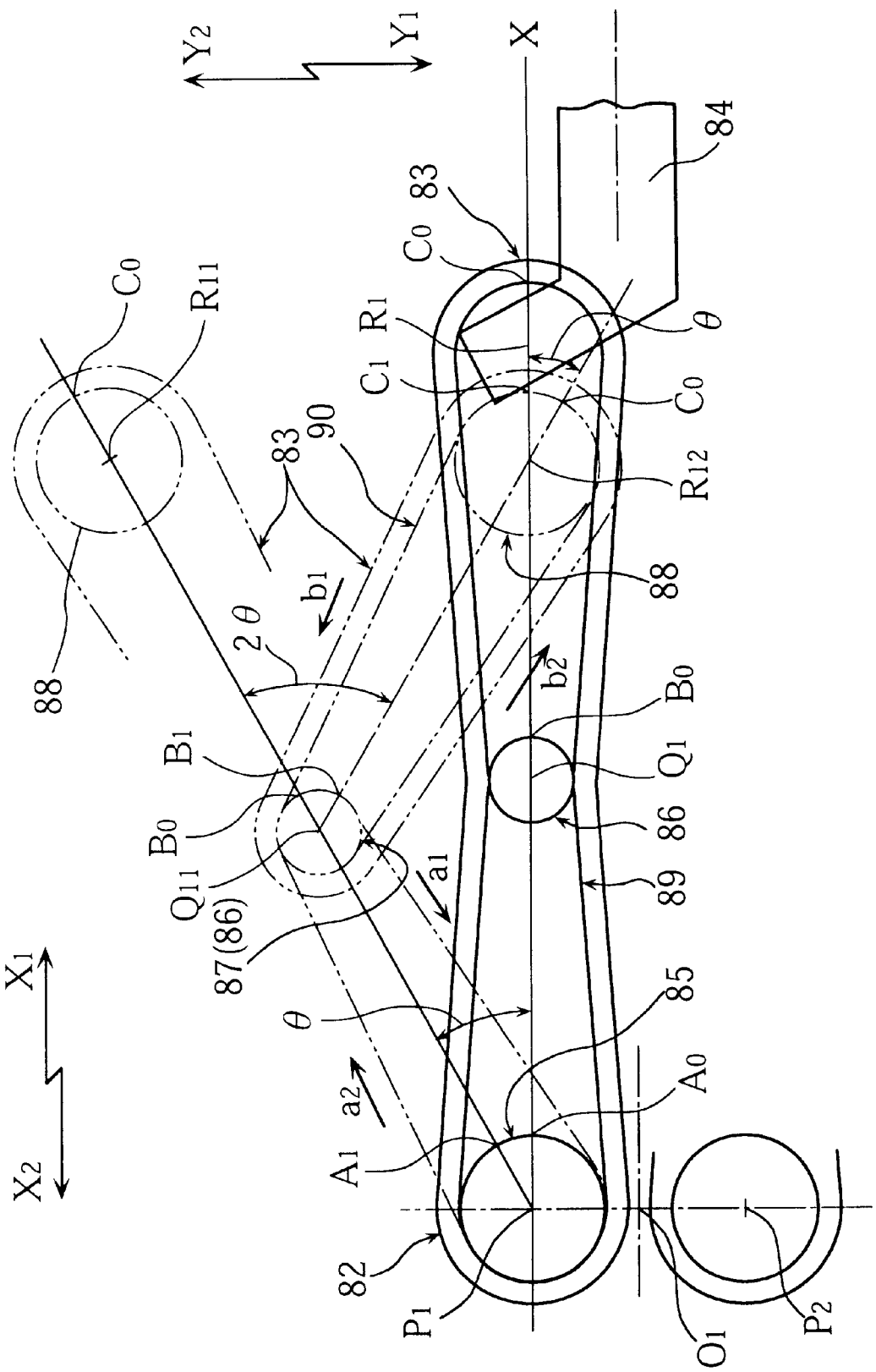
FIG. 16 is a plan view illustrating the movement of parts shown in FIG. 14.
Figure 17:
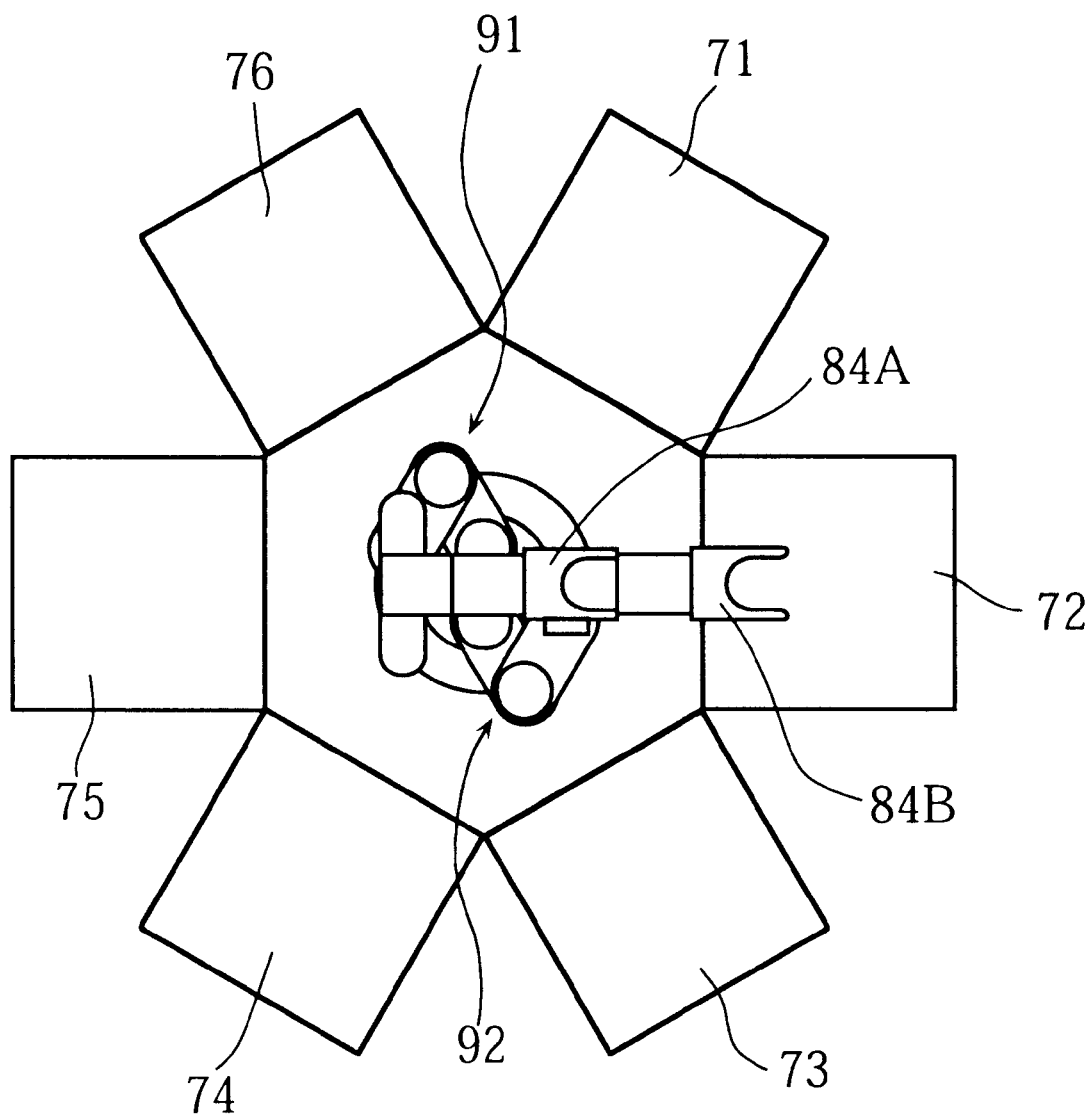
FIG. 17 is a plan view illustrating the transfer robot of FIG. 14 in operation.

FIGS. 12 and 13 show a two-armed transfer robot according to a second embodiment of the present invention. The illustrated transfer robot is basically similar to the transfer robot of the first embodiment except that use is made of a horizontally extending cover member 50 arranged between the first and second handling members 28, 48. The cover member 50 is formed with a central opening for allowing the passage of the vertical rotation shafts of the transfer robot. As is easily understood from FIG. 12, the first handling member 28 can be moved under the cover member 50 without being interfered with by the cover member, while the second handling member 48 can also be moved freely above the cover member 50.

With such an arrangement, it is possible to prevent small particles (such as dust) coming off the upper arm mechanism from falling onto the lower arm mechanism, in particular, onto a workpiece placed on the first handling member 28. Thus, the transfer robot of the second embodiment is advantageously used for a semiconductor manufacturing apparatus installed in a vacuum chamber.

The preferred embodiments of the present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A two-armed transfer robot comprising:

a first arm mechanism and a second arm mechanism, each arm mechanism being provided at an extremity thereof with a handling member for carrying a workpiece to be processed, the handling member arranged not only to linearly move in a horizontal plane but to rotate in the horizontal plane;

a stationary base member;

first to fourth shafts rotatable about a first axis extending vertically, each shaft being coaxially supported by the base member; and first to fourth driving devices associated with the first to the fourth shafts, respectively, each driving device being attached to the base member;

wherein the first arm mechanism has a pantograph assembly including a first arm, an outer link, a pair of intermediate links and an inner link, the first arm being connected to the first shaft, the outer link being supported with respect to the first arm for pivotal movement about a second axis extending in parallel to the first axis, each intermediate link being supported with respect to the outer link for pivotal movement about a third axis, the third axes being spaced outward from the second axis, the second axis being located between the third axes as viewed circumferentially about the first axis, the inner link being supported with respect to each intermediate link for pivotal movement about a fourth axis located at a free end of said each intermediate link, the inner link being spaced from the first to fourth shafts, a distance between the third axis and the fourth axis being equal to a distance between the first axis and the second axis;

the first arm mechanism further having a first rotation-transmitting member fixed to the second shaft, a second rotation-transmitting member fixed to the outer link in a coaxial manner with the second axis, a third rotation-transmitting member fixed to the first arm in a coaxial manner with the second axis, a pair of fourth rotation-transmitting members each fixed to one of the intermediate links in a coaxial manner with the third axis, a first connecting member extending between the first and the second rotation-transmitting members, and a second connecting member extending between the third and the fourth rotation-transmitting members;

the handling member being spaced from the first to fourth shafts when the handling member is retreated closer to the shafts;

the first arm being inclined about the first axis in a direction opposite to the handling member when the handling member is retreated closer to the shafts, while each intermediate link being inclined about its third axis in a direction opposite to the handling member when the handling member is retreated closer to the shafts;

the second arm mechanism being connected to the third and fourth shafts, the second arm mechanism being substantially identical to the first arm mechanism, the handling member of the first arm mechanism being spaced vertically from the handling member of the second arm mechanism;

the handling members of the first and second arm mechanisms being arranged not only to linearly move in horizontal straight lines passing through the first axis but to rotate independently of each other around the first axis.

2. The two-armed transfer robot according to claim 1, further comprising a cover member arranged between the handling member of the first arm mechanism and the handling member of the second arm mechanism, the cover member being formed with an opening for allowing passage of the shafts.

3. The two-armed transfer robot according to claim 1, wherein each of the first to the fourth shafts is rotatably supported via a magnetic fluid seal for hermetic sealing.

* * * * *